United States Patent
Rüb et al.

(10) Patent No.: US 8,492,771 B2
(45) Date of Patent: Jul. 23, 2013

(54) HETEROJUNCTION SEMICONDUCTOR DEVICE AND METHOD

(75) Inventors: Michael Rüb, Faak am See (AT); Michael Treu, Villach (AT); Armin Willmeroth, Augsburg (DE); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 590 days.

(21) Appl. No.: 11/862,661

(22) Filed: Sep. 27, 2007

(65) Prior Publication Data

US 2009/0085064 A1 Apr. 2, 2009

(51) Int. Cl.
*H01L 29/15* (2006.01)
*H01L 31/0312* (2006.01)

(52) U.S. Cl.
USPC .............. 257/77; 257/76; 257/78; 257/192; 257/194; 257/E29.081

(58) Field of Classification Search
USPC ............................................ 257/77, E29.081
See application file for complete search history.

(56) References Cited

U.S. PATENT DOCUMENTS

| | | | | |
|---|---|---|---|---|
| 5,709,745 A | * | 1/1998 | Larkin et al. | 117/96 |
| 6,054,352 A | * | 4/2000 | Ueno | 438/268 |
| 2004/0079989 A1 | * | 4/2004 | Kaneko et al. | 257/328 |

FOREIGN PATENT DOCUMENTS

| | | |
|---|---|---|
| DE | 19641839 | 5/1997 |
| DE | 102005047054 | 4/2007 |
| WO | 2007016966 | 2/2007 |

OTHER PUBLICATIONS

Translation of Description of Rueb et al., DE102005047054.*

* cited by examiner

*Primary Examiner* — Hsin-Yi Hsieh
(74) *Attorney, Agent, or Firm* — Dicke, Billig & Czaja, PLLC (57) ABSTRACT

A semiconductor device includes a first semiconductor substrate of a first band-gap material and a second semiconductor substrate of a second band-gap material. The second band-gap material has a lower band-gap than the first band-gap material. A heterojunction is formed between the first semiconductor substrate and the second semiconductor substrate substantially in a first plane. The semiconductor device further includes, in a cross-section which is perpendicular to the first plane, a first semiconductor region of a first conductivity type and a second semiconductor region of the first conductivity type both of which extend from the second semiconductor substrate at least partially into the first semiconductor substrate. The first and second semiconductor regions are spaced in the first semiconductor substrate from each other in a direction parallel to the first plane by a first distance which is arranged in an area proximate to the heterojunction and which is larger than a second distance which is arranged in an area distal to the heterojunction.

13 Claims, 10 Drawing Sheets

HETEROJUNCTION SEMICONDUCTOR DEVICE AND METHOD

BACKGROUND

Electronically-controlled switching devices such as a Metal Oxide Semiconductor Field Effect Transistors (MOSFET) or an Insulated Gate Bipolar Transistors (IGBT) have been used for various applications.

Devices capable of switching large currents, including but not limited to power devices, that have a low resistance in a conductive on-state or forward bias and that have a high breakdown voltage in an off-state or reversed bias minimize losses in the on-state and avoid possible damage during the off-state or reversed bias that may occur during operation of the device.

SUMMARY

One embodiment includes a semiconductor device, in a power switching device, including a heterojunction and a manufacturing method therefor. According to an embodiment, a semiconductor device includes a first semiconductor substrate of a first band-gap material and a second semiconductor substrate of a second band-gap material. The second band-gap material has a lower band-gap than the first band-gap material. A heterojunction is formed between the first semiconductor substrate and the second semiconductor substrate at least partially and typically substantially in a first plane. The semiconductor device further includes, in a cross-section which is perpendicular to the first plane, a first and a second semiconductor regions of the first conductivity type which extend from the second semiconductor substrate at least partially into the first semiconductor substrate. The first semiconductor region and the second semiconductor region are spaced in the first semiconductor substrate from each other in a direction parallel to the first plane by a first distance which is arranged in an area proximate to the heterojunction and is larger than a second distance which is arranged in an area distal to the heterojunction.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

A full and enabling disclosure of the present invention, including the best mode thereof, to one of ordinary skill in the art, is set forth more particularly in the remainder of the specification, including reference to the accompanying figures. Therein.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only.

The term "lateral" as used in this specification intends to describe an orientation parallel to a first surface of a semiconductor substrate or body. This can be for instance the surface of a wafer or a die.

The term "vertical" as used in this specification intends to describe an orientation which is arranged perpendicular to the first surface of the semiconductor substrate or body.

Specific embodiments described in this specification pertain to switching semiconductor devices, particularly to field-effect controlled power semiconductor devices such as vertical IGBTs and vertical MOSFETs.

The embodiments which are subsequently described are heterojunction semiconductor devices formed by a combination of a high and a low band-gap semiconductor material. Due to high charge carrier mobility in the low-band-gap semiconductor material, the channel of the MOSFET or IGBT is formed therein wherein the high breakdown resistance of the high band-gap semiconductor material is employed to form a drift region which can sustain high reverse voltages.

Figure 1:
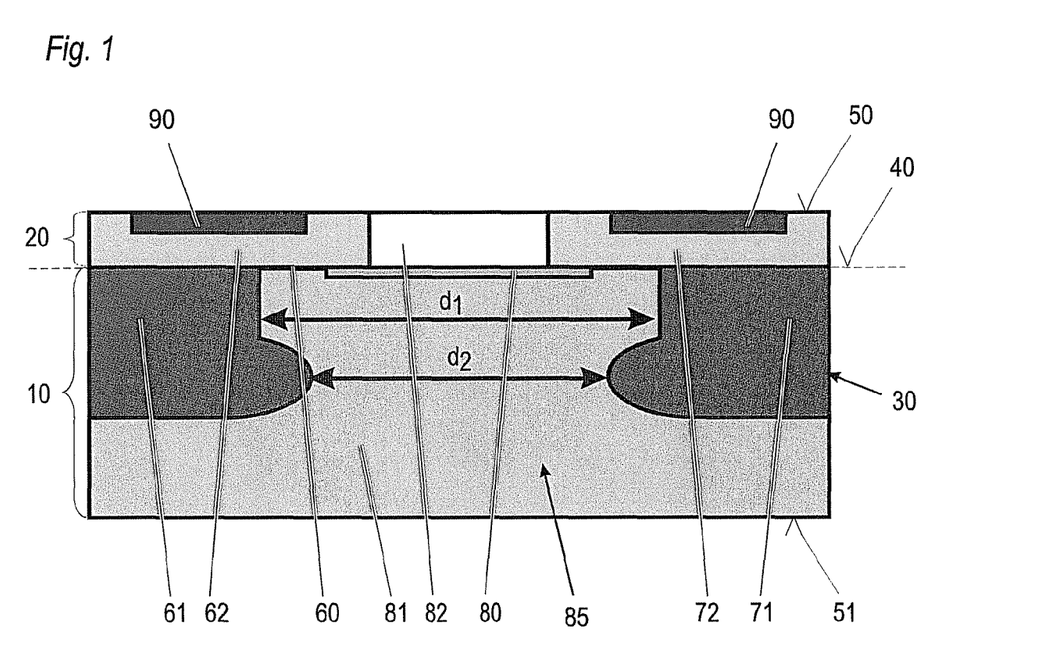
FIG. 1 illustrates a vertical cross-section of a semiconductor device according to an embodiment.

FIG. 1 illustrates an embodiment of a semiconductor device in a vertical cross-section which is perpendicular to a first plane 40. The first plane 40 runs substantially parallel to a first surface 50 of a semiconductor body 30 which can be for instance a wafer or a die.

The semiconductor body 30 includes a first semiconductor substrate 10 of a first band-gap material. Typically, the first plane 40 forms a surface of the first semiconductor substrate 10. The first semiconductor substrate 10 can, for example, be silicon carbide (SiC). The material of the first semiconductor substrate 10 is, however, not limited to SiC and can also include gallium nitride (GaN). The first semiconductor substrate 10 is of a second conductivity type which is in this embodiment n-type.

The first semiconductor substrate 10 can be of a single-crystalline substrate and an epitaxial layer formed thereon. The epitaxial layer can have a thickness from about 5 μm to about 8 μm and is typically a low-doped layer having a doping concentration from about $1*10^{15}/cm^3$ to about $5*10^{16}/cm^3$ for a 600V device. In FIG. 1, the single-crystalline body is not illustrated. The epitaxial layer has typically a lower doping concentration than the single-crystalline substrate and forms a first portion of a drift region 85 of the semiconductor device. By using an epitaxial layer the doping concentration of the drift region and therefore the on-state resistance and the breakdown voltage of the device can be adjusted.

The semiconductor body 30 further includes a second semiconductor substrate 20 of a second band-gap material which has lower band-gap than the first band-gap material of the first semiconductor substrate 10. The second semiconductor substrate 20 can, for example, be of silicon (Si). The material of the first semiconductor substrate 20 is, however, not limited to Si and can also include germanium (Ge). The second semiconductor substrate 20 is also of the second conductivity type. Typically, the second semiconductor substrate 20 has a thickness in a direction perpendicular to the first plane 40 between about 0.2 μm and about 3.0 μm. The second semiconductor substrate 20 is typically an epitaxial semiconductor layer deposited on the first semiconductor substrate 10.

Typically, the first semiconductor substrate 10 can have a higher doping concentration of the second conductivity type than the second semiconductor substrate 20. The doping concentration of the first semiconductor substrate 10 can for instance be 5-times and, for example, up to 10-times higher than the doping concentration of the second semiconductor substrate 20. Since a high band-gap material is used for the first semiconductor substrate 10, which can sustain higher electrical field strength, its doping concentration can be increased to reduce the on-state resistance of the semiconductor device.

A heterojunction 60 is formed at the interface between the first semiconductor substrate 10 and the second semiconductor substrate 20 and extends at least partially and typically substantially in the first plane 40.

In the cross-section perpendicular to the heterojunction 60, a first semiconductor region 61 and a second semiconductor region 71 both of a first conductivity type are arranged at least partially in the first semiconductor substrate 10 and are separated from each other in a lateral direction, that is, in a direction parallel to the first plane 40, by a first distance d1 arranged in an area proximate to the heterojunction 60 and by a second distance d2 arranged in an area distal to the heterojunction 60. The first distance d1 is larger than the second distance d2. In other words, the portion of the drift region 85 which is at least partially enclosed by the spaced apart first semiconductor regions 61 and 71 exhibits, in a lateral direction, a constriction or a narrowing which is distal to, or spaced from, the heterojunction 60. Typically, the ratio d1:d2 is about from 1:1 to about 4:2.5.

The portion of the drift region 85, which has a reduced cross-section (constriction), is formed in the first portion 81 of the drift region. The first portion 81, which is of the second conductivity type, is arranged in the first semiconductor substrate between the first and second semiconductor regions 61, 71 to thereby separate the first and second semiconductor 61, 71 from each other in the vertical cross-section. The first portion 81 forms pn-junctions with the first and second semiconductor regions 61, 71, respectively. The first and second conductivity type corresponds to p-dopant type and n-dopant type in this embodiment, respectively. It will, however, be appreciated by those skilled in the art that the doping can be reversed.

The lateral constriction of the drift region 85 and particular of the first portion 81 in the first semiconductor substrate 10 is distal to, or spaced from, the heterojunction 60. This means, that the first portion 81 of the drift region 85 includes a minimum cross sectional area in a plane which is parallel and distal to the first plane 40 or the heterojunction 60, respectively. As explained in more detail below, this lateral constriction of the drift region 85 in the first semiconductor substrate 10 is for protecting the heterojunction 60 against high field strength during a reversed voltage bias. Those portions of the first and second semiconductor regions 61, 71, which define the lateral constriction, can be referred to as body extensions or compensating structures since they provide a compensation charge for improved depletion of the confined portions of the drift region.

The first and second semiconductor regions 61, 71 have a given vertical extension in the first semiconductor substrate 10. Typically, the vertical extension of the first and second semiconductor regions 61, 71 from the heterojunction 60 into the first semiconductor substrate 10 is from about 3 μm to about 6 μm. The lateral constriction of the drift region 85 is typically spaced from the heterojunction 60 by about 2 μm to about 5 μm.

In certain embodiments, body regions 62 and 72 of the first conductivity type are arranged in the second semiconductor substrate 20. The body regions 62 and 72 are spaced by a second portion 82 of the drift region 85 which is arranged in the first semiconductor substrate 10. The second portion 82 is in contact with the first portion 81 of the drift region 85. In other words, the interface between both portions forms at least a portion of the heterojunction 60 within the drift region 85.

Typically, the first and second semiconductor regions 61 and 71 extend from the second semiconductor substrate 20 into the first semiconductor substrate 10 and form in the second semiconductor substrate 20 the body regions 62 and 72, respectively. As further explained below, the first and second semiconductor regions 61, 71 can have a different doping concentration in the area of the body regions 62, 72, that is, in the second semiconductor substrate 20, than in the first semiconductor substrate 10. This is due to the different purpose of the body regions 62, 72 in second semiconductor substrate 20 in comparison with the purpose of the first and second semiconductor regions 61, 71 in the first semiconductor substrate 10.

Depending on the layout of the semiconductor device, the first and second semiconductor regions 61, 71 can be portions of a connected semiconductor region. For example, the first and second semiconductor regions 61, 71 can be, in a projection on the first plane 40, portions of a ring-like semiconductor region which surrounds portions of the drift region 85. In a vertical cross-section through the ring-like semiconductor region, however, semiconductor regions 61 and 71 appears to be separate regions. In case of a bar layout, semiconductor regions 61, 71 belongs to separate adjacent bars running parallel to each other. Other layouts such as hexagonal structures can also be used.

Figure 7:
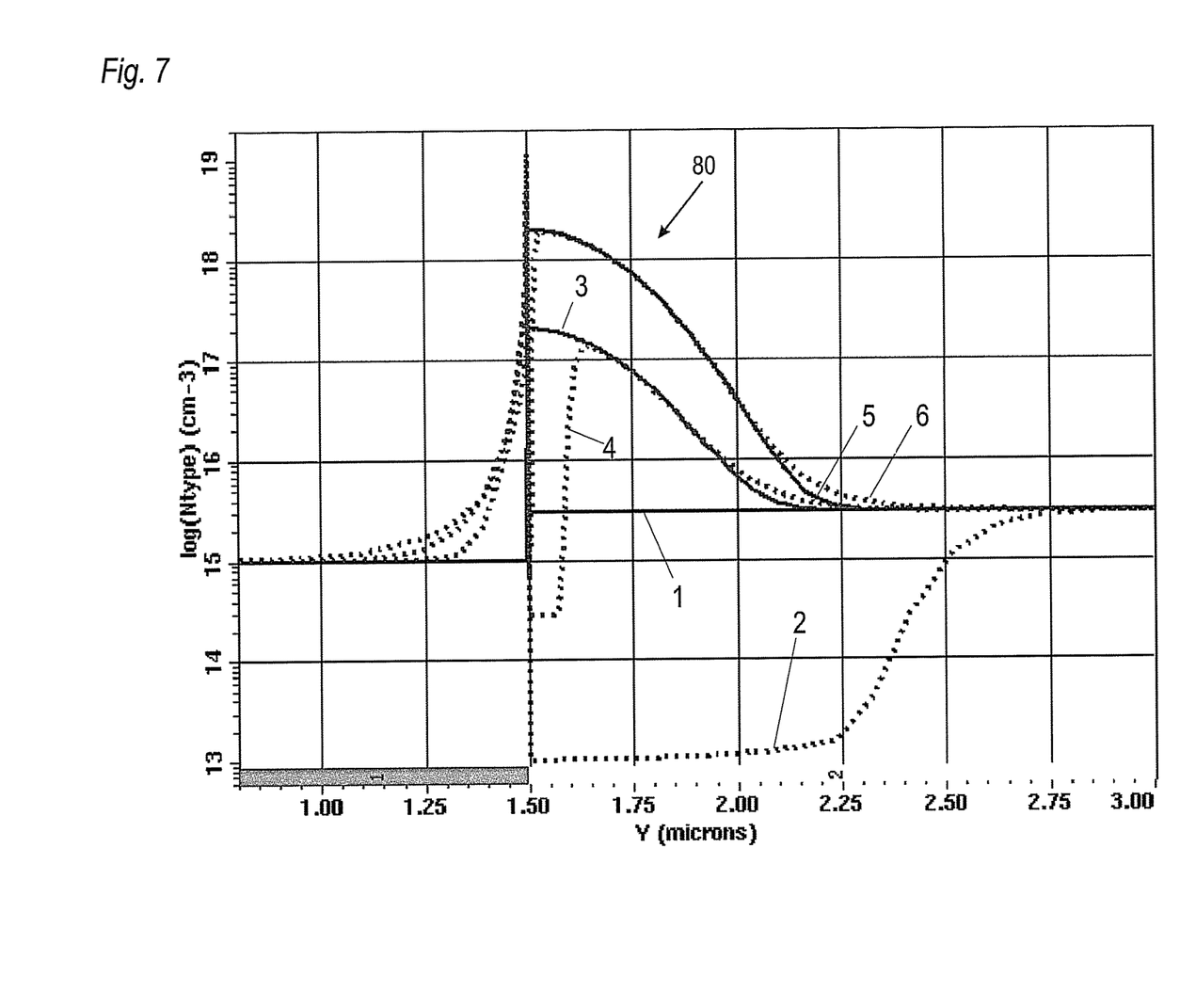
FIG. 7 illustrates doping concentrations and free electron concentrations across a semiconductor heterojunction.

In the on-state, a substantially vertical current typically flows through the first portion 81 and the second portion 82 of the drift region 85, that is, the current flow crosses the heterojunction 60. Due to the different material properties, in different Fermi energies, charge carrier depletion occurs in the first semiconductor substrate 10 at the heterojunction 60. A typical situation is illustrated in FIG. 7 for n-type doped semiconductor regions. It will, however, be appreciated by those skilled in the art that the doping can be p-type, too. FIG. 7 illustrates doping concentrations (full lines 1, 3 and 5) and corresponding electron concentrations (dotted lines 2, 4 and 6) along a line crossing a Si—SiC heterojunction at y=1.5 μm, wherein the Si-substrate and SiC-substrate are arranged left and right to the heterojunction in FIG. 7, respectively. As can be appreciated from the curves 1 and 2, the electron concentration (curve 2) is significantly reduced in SiC-substrate close to the heterojunction. This would cause an increase of the device resistance in the on-state. Note, that the increase of free charge concentration, that is, electron concentration in the Si-substrate close to the heterojunction can not counterbalance the increase of resistance in SiC-substrate.

Therefore, in certain embodiments, the drift region 85 close to the heterojunction includes a semiconductor region 80 (FIG. 1) of high doping concentration as illustrated in FIG. 1 for compensating the charge carrier reduction at the heterojunction. In other words, the semiconductor body 30 includes the first semiconductor substrate 10, the second semiconductor substrate 20, and the heterojunction 60 formed between the first and second semiconductor substrates 10 and 20. The optional semiconductor region 80 formed at the heterojunction 60 includes a higher doping concentration than an adjoining region in the first semiconductor substrate 10. The semiconductor region 80 is of the second conductivity type. Typically, the semiconductor region 80 is arranged at least between the first and second semiconductor regions 81 and 82.

Due to its purpose, the semiconductor region 80 can also be referred to as charge carrier depletion compensation region. It goes without saying that a charge carrier depletion compensation region 80 can also be employed in semiconductor devices which do not include the first and second semiconductor regions 61, 71 in the first semiconductor substrate 10. For example, if the device does not require a protection of its heterojunction against high electrical field strength, a charge carrier depletion compensation region can be provided at the heterojunction only for compensating the above described charge carrier depletion.

If the charge carrier depletion region close to the heterojunction 60 extends into the second semiconductor substrate 20, the semiconductor region 80 of the higher doping concentration can be arranged at the heterojunction 60 but substantially in the second semiconductor substrate 20.

The region of free charge carrier depletion close to the heterojunction 60 extends typically only up to a few ten nanometers. Therefore, the semiconductor region 80 at the heterojunction 60 typically has an extension in the direction perpendicular to the heterojunction 60 or first plane 40 of about 5 nm to about 50 nm. In other words, the semiconductor region 80 is typically formed as an interfacial layer or thin vertical delta-layer.

Further the doping concentration of the semiconductor region 80 typically exceeds the doping concentration of an adjoining region in the first semiconductor substrate 10 at least 10 times. In certain embodiments, the ratio of the respective doping concentrations can even be higher than 50 or even higher than 100. As can, for example, be appreciated from the curves 3 to 6 this is enough to compensate the reduction of free charge carriers at the heterojunction 60. In this case an about 20 nm thin semiconductor region 80 in the SiC-substrate next to the heterojunction 60 was doped with a 100 times (about $2*10^{17}/cm^3$ for curve 3) and 1000 times (about $2*10^{18}/cm^3$ for curve 5) higher peak doping concentration compared to the base doping concentration of adjacent regions of the SiC substrate (first semiconductor region 10) of about $2*10^{15}/cm^3$. According to the curves 4 and 6 illustrating the electron concentrations, which correspond to the doping concentration of the curves 3 and 5, a reduction or depletion of free charge carriers at the heterojunction between Si and SiC can be balanced by peak doping concentrations of the semiconductor region 80 that are at least 100 times higher than the base doping concentration of adjacent semiconductor regions.

By reducing or compensating the charge carrier depletion, semiconductor region 80 reduces the resistance of the heterojunction 60 in the drift region 85. Further, semiconductor region 80 also reduces leak currents which might be generated at the heterojunction 60 if a lattice mismatch between first and second semiconductor substrate occurs.

Since the first semiconductor substrate 10 has a higher band-gap compared to the second semiconductor substrate 20 it includes a higher breakdown voltage. In certain embodiments the doping concentration of the first portion 81 is, therefore, equal to or even higher than the doping concentration of the second drift portion 82. For example, SiC has, depending on polytype, an up to 10-times higher breakdown voltage than Si. Therefore, it can be higher doped, thereby decreasing the overall resistance $R_{on}$ in the on-state of the semiconductor device. On the other hand, Si includes a higher mobility of charge carriers which is especially important for the channel region of a MOS switching semiconductor device. A heterojunction semiconductor device can take both advantages if the main part of the drift region is arranged in the first semiconductor substrate 10 while the channel region is arranged and in the second semiconductor substrate 20. As further explained below, the first and second semiconductor regions 61, 71, particularly their reduced distance d2 distal to the heterojunction 60, prevent that high electrical field strength occurs at and close to the heterojunction 60.

According to certain embodiments, a source region 90 of a second conductivity type is arranged in each of the body regions 62 and 72 at the surface 50 of the second semiconductor substrate 20. Portions of the body regions 62, 72 are arranged between the respective source region 90 and the second portion 82 of the drift region 85. A conductive inversion channel is formed in those portions arranged between the source regions 90 and the second portions 82 of the drift region 85 in forward mode.

Figure 2:
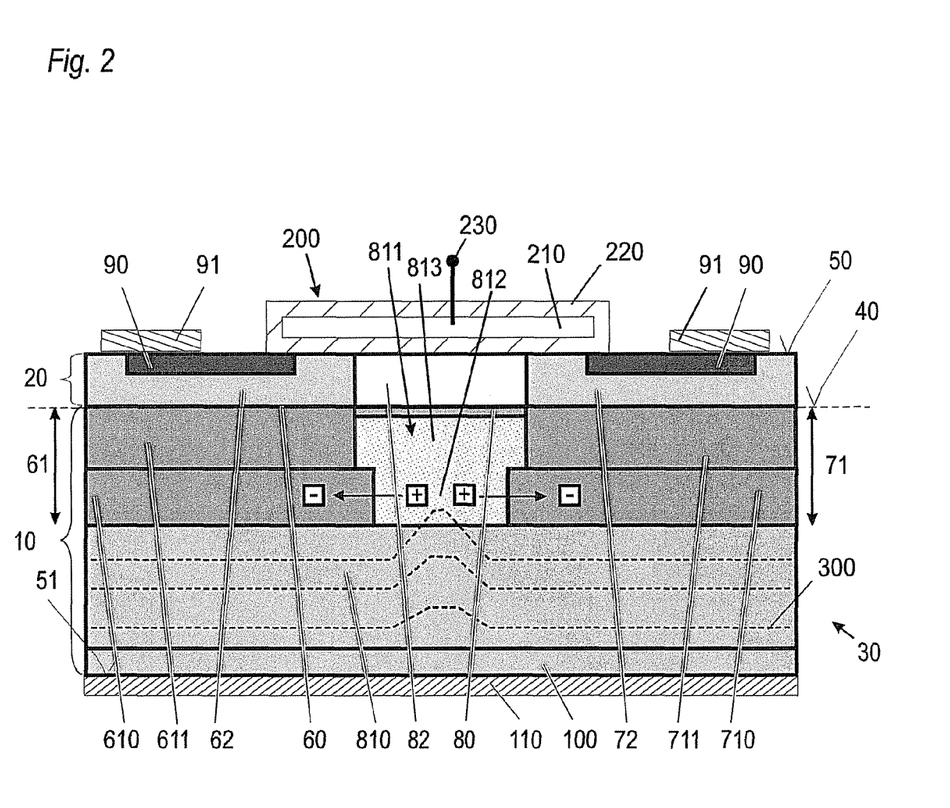
FIG. 2 illustrates a vertical cross-section of a semiconductor device according to another embodiment.

With respect to FIG. 2 further embodiments will be explained. The structure of the embodiment illustrated in FIG. 2 can be based on any of the above described embodiments. Similar to the above described embodiments, FIG. 2 illustrates the semiconductor body 30 which includes the first semiconductor substrate 10 and the second semiconductor substrate 20 formed by a lower band-gap material than the first semiconductor substrate 10, wherein the heterojunction 60 is formed between the first 10 and second 20 semiconductor substrates at least partially and typically substantially in the first plane 40. Further, the first portion 81 of the drift region 85 arranged in the first semiconductor substrate 10 has a lateral constriction (or reduced cross-sectional area) in a plane distal to the heterojunction 60. The semiconductor body 30 further includes, in the vertical cross-section, body regions 62 and 72 which are arranged in the second semiconductor substrate 20 and spaced apart by the second drift portion 82. Further, in the vertical cross-section, respective source regions 90 which adjoin the body region 62 and 72 are arranged at the first surface 50 of the semiconductor body 30.

In certain embodiments, the first semiconductor region 61 includes first and second portions 610 and 611 and the second semiconductor region 71 includes first and second portions and 710 and 711. The first (upper, proximate) portions 611 and 711 are proximate to the heterojunction 60. In contrast, the second (lower, distal) portions 610 and 710 are distal to, and spaced from, the heterojunction 60. Typically, both the portions 610 and 611 and the portions 710 and 711 adjoin each other, respectively. Further, the portions 610 and 710 are spaced apart from each other by a smaller distance than the portions 611 and 711. Thereby a lateral constriction which is distal to the heterojunction 60 is formed. Second portions 610 and 710 restrict the cross-sectional area of the first portion 81 and have a larger lateral extension than the first portions 611, 711.

Further, the first portion 81 of the drift region 85 can include first and second areas 810 and 811 of the second conductivity type in the first semiconductor substrate 10, wherein the second area 811 is arranged on and in contact with the first area 810. The second area 811 is laterally restricted by the first and second semiconductor regions 61, 72 and arranged between the second portion 82 of the drift region 85 and the first area 810. Typically, the first area 810 assumes the portion of the first semiconductor substrate 10 which is arranged below the first and second semiconductor regions 61, 71. The doping concentration of the first area 810 can be equal to or higher than the second area 811. A high doping concentration ensures that the main voltage drop occurs distal to the heterojunction 60.

When considering the drift region 85 alone, the semiconductor device therefore can include a low-doped region and a high-doped region. The low-doped region includes the second portion 82, the heterojunction 60 and the second area 811, wherein the high-doped region is mainly formed by the first area 810. The doping concentration in the low-doped region can be different in the first and second semiconductor substrate. The high-doped region can have a doping concentration of about up to 10 times higher than the low-doped region. The purpose of the high-doped region, which is distal to the heterojunction 60, is to relieve the main portion of the reverse voltage. To protect the heterojunction 60, the low-doped region has a constriction or reduced cross-section area typically close to the high-dope region.

The semiconductor body 30 can further include a drain region 100 of a second conductivity type which is arranged at a second surface 51 of the first semiconductor substrate 10. The second surface 51 is typically opposite to the first surface 50 of the semiconductor body 30. The drain region 100 is of the second conductivity type. In this case, the semiconductor device is a MOSFET. Alternatively, an emitter region of the first conductivity type can be formed at the second surface to provide an IGBT. In both cases, a field stop layer (not illustrated) of a second conductivity type, which has a higher doping concentration than the first portion 81 or the first area 810 of the drift region 85, can be arranged between the drift region 85 and the drain or emitter region 100, respectively.

A front electrode 91 can be arranged in contact with each source region 90 on the first surface 50 of the semiconductor body 30. Typically, a pn-junction between a respective source region 90 and the adjoining body regions 62 and 72 is formed. To avoid biasing these pn-junctions, an electrical contact between the front electrode 91 and the body region 62 and 72 can additionally be provided. Further, the body regions 62 and 72 and/or the source regions 90 can be contacted to a common electrode 91. This simplifies contacting and overall production costs of the semiconductor device and provides a parallel connection of respective cells of the power semiconductor device.

In certain embodiments the drain or the emitter region 100 is in contact with a back metallisation or back electrode 110. The back electrode 110 is typically formed on the second surface 51.

In case of a power semiconductor device, several or a plurality of substantially identical semiconductor cells can be switched in parallel, thereby increasing the switchable current. For this purpose several or a plurality of substantially identical semiconductor cells can be lattice-like arranged in a lateral plane. In certain embodiments a plurality of cells is connected to a common front electrode 91 and a common back electrode 110. Further a common gate electrode 200 is arranged close to respective body regions 62, 72 and the second drift portion 82.

Further, the semiconductor body 30 can include a gate electrode 200 close to the body regions 62 and 72. Typically, the gate electrode 200 is arranged on the first surface 50 and includes a metal electrode or polysilicon electrode 210 in contact with an external connection 230 but insulated from the semiconductor body 30 by an insulating layer 220 which typically includes silicon oxide ($SiO_2$). The material of the insulating layer 220 is, however, not limited to $SiO_2$ and can also include so-called high-k dielectrics. The insulated gate electrode 200 can also partially cover the source regions 90.

In operating the semiconductor device, a current path is typically provided in the on-state between the source region 90 and the back electrode 110. For this purpose an inversion channel is formed within each body region 62 and 72 close to the gate electrode 200 by applying an appropriate voltage to the gate electrode 200. For example, in case of p-type body regions 62 and 72 an n-type inversion channel is formed within each of the body regions 62 and 72 if the voltage applied to the gate electrode 200 is higher than a threshold voltage. This means that the voltage of the gate electrode 200 has to exceed the voltage of the source electrodes 90 by a certain amount.

In certain embodiments the current flows substantially lateral in the channel region close to the first surface 50 and substantially vertical in the drift region 85. The resistance $R_{on}$ of the semiconductor device in the on-state depends both on the resistances of the channel region and the drift region. In one example, therefore, a semiconductor material such as Si, which includes high charge carrier mobility as second semiconductor substrate, is used to minimize the resistance of the channel region. If the first semiconductor substrate includes a high band gap material such as SiC, which has a high breakdown voltage or high critical avalanche field strength, the doping of the first portion 81 of the drift region can be increased which reduces the resistance $R_{on}$, too. To take full advantage of such a material combination, the heterojunction 60 is protected against high field strength in case of a reversed voltage applied between the front and back electrode 91, 110. For this purpose, the first and second semiconductor region 61 and 71 are appropriately arranged.

To illustrate the effect of the first and second semiconductor regions 61, 71, a reference device is considered. Assume that the reference device has a SiC-substrate forming the first semiconductor substrate and a Si-substrate forming the second semiconductor substrate both of which are of the second conductivity type and form the drift region. No first and second semiconductor regions of the first conductivity type are formed in the SiC-substrate. Since the Gaussian law requires that the normal component of the electric field strength times the relative permittivity is constant at the plane heterojunction between Si and SiC, the following is valid:

$$\epsilon(Si)*E(Si)=\epsilon(SiC)*E(SiC).$$

This yields:

$$E(SiC)=\epsilon(Si)/\epsilon(SiC)*E(Si).$$

For example, in case of a heterojunction between Si and the SiC-polytype 3C—SiC the ration between ∈(Si) and ∈(SiC) is about 1.21. If the maximum electrical field strength, which Si can sustain before a breakdown occurs, is $E_{max}$, the electric field strength in SiC should not be higher than $1.21*E_{max}$ to avoid an electrical breakdown in Si. However, 3C—SiC can sustain a critical avalanche field strength which is about 4 times higher than that of silicon. This means that 3C—SiC could sustain a critical avalanche field strength equal to about $4*E_{max}$ before an electrical breakdown occurs. Note that the polytypes 6H—SiC and 4H—SiC have even higher critical avalanche field strengths which exceed the value of silicon about 8 to 10 times, respectively. If the highest electric field strength in the device occurs close to the heterojunction 60 an avalanche breakdown is likely to happen on the silicon side of the heterojunction at a field strength which is significantly below the critical avalanche field strength of SiC. Consequently, the high breakdown voltage of SiC cannot be fully employed in the above reference device.

To take full advantage of the high breakdown voltage of SiC the heterojunction should be protected and shielded against high field strength. For this purpose the first portion 81 of the drift region is laterally constricted in an area distal to the heterojunction 60 by the first and second semiconductor regions 61, 71. The first and second semiconductor regions 61 and 71 cause the portion of drift region arranged therebetween to be completely depleted under reverse conditions which results in a shielding of the heterojunction 60 and the second semiconductor substrate from high electrical field strength. The main part of the reverse voltage drops in the drift region 85 below the first and second semiconductor regions 61, 71.

The influence of the first and second semiconductor regions 61, 71 on the electrical field distribution can be explained—without wishing to be tied thereto—by illustrating the electrical potential. Iso-potential lines 300 at reverse bias are illustrated in FIG. 2. As indicated in FIG. 2, the potential lines are substantially parallel to the plane pn-junction formed at the lower end of the first and second semiconductor regions 61 and 71, but bend inwardly into the second area 811 of the first portion 81 of the drift region 85. By restricting the cross-sectional area of the first portion 81 of the drift region 85, particularly of the second area 811 between the portions 610 and 710 of the first and second semiconductor regions 61 and 71, a distal area 812 of the second portion area 811, is mainly laterally depleted, that is, that only positive fixed charges symbolized by "+" in FIG. 2 remain in the completely depletable distal area 812. As a consequence, the potential cannot deeply "penetrate" the first area 811 and the heterojunction 60 is shielded from a high electrical field.

At least partial depletion takes place in a proximate area 813 of the second area 811. It is assumed however that the distal area 812 is depleted first by virtue of its lateral restriction by the oppositely doped first and second semiconductor regions 61, 71 which results in a pinching-off of the electrical field. The extent of the shielding depends for instance on the lateral distance between the first and the second semiconductor regions 61, 71, particularly of the lateral distance between their respective portions 610 and 710. Due to the complete depletion of the distal area 812, the proximate area 813, which is laterally confined by the portions 611 and 711 of the first and second semiconductor region 61, 71 and which is arranged between the distal area 812 and the heterojunction 60, will not be completely depleted so that the electrical field strength in the proximate region 813 will be lower.

In certain embodiments, the second area 811 of the first drift portion 81 has a lower doping concentration than the first area 810. First area 810 is in contact with first and second semiconductor regions 61, 71 at their lower edge while the second region is arranged between the first and second semiconductor regions 61, 71.

A complete shielding could be obtained by minimizing the distance d2, which would, however, significant increase the resistance of the first portion 81 of the drift region in the on-state. In one example, the portions 610 and 710 are arranged such that they cause a substantially complete depletion of the distal area 812 of the first portion 81 without significant reducing the on-state resistance. This provides a sufficient protection of the heterojunction 60 which is confirmed in the below discussed simulations since the main voltage drop at reverse conditions occurs distant to the heterojunction 60 and the second semiconductor substrate 20. Typically, the maximum electric field strength at the heterojunction 60 is at least 10 times lower than the maximum electric field strength at the plane pn-junctions in the first semiconductor substrate 20.

In certain embodiments the second portions 610 and 710 and/or the first portions 611 and 711 are not completely depletable. In other words, the overall amount of dopant in those regions of the first conductivity type is typically larger than the overall amount of dopant in the distal area 812 of the second conductivity type in the first semiconductor substrate. Typically, the doping concentration of the first and second portions 611, 711, 610, 710 is higher than the doping concentration of the second are 811 and particularly of the distal area 812. Note that portions 611, 711, 610, 710 are of opposite conductivity type to area 811 to function as compensation structures.

In general terms, the lateral depletion of parts of the drift region in the first semiconductor substrate is improved by arranging portions of the first conductivity type such that the first portion 81 of the drift region includes a lateral constriction which is distal to the heterojunction 60.

Figure 3:
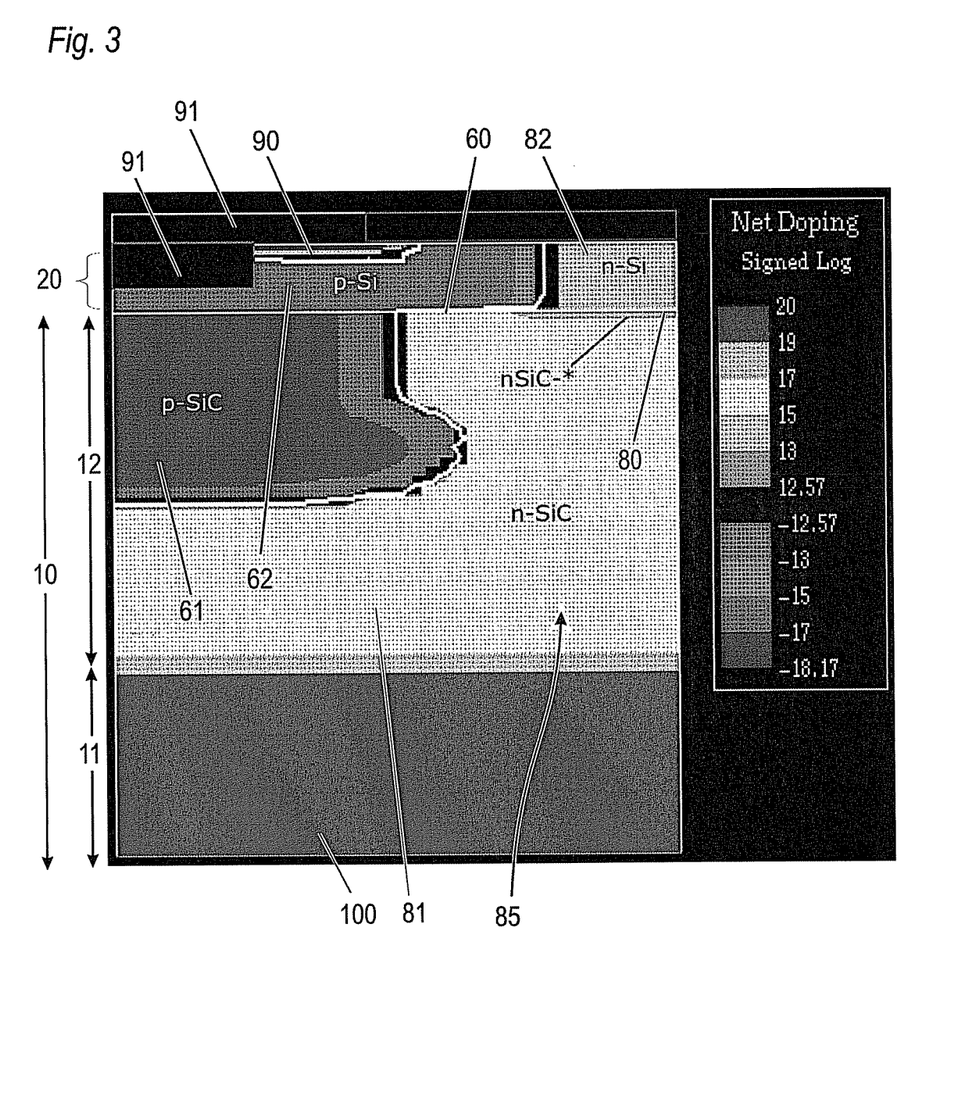
FIG. 3 illustrates in a vertical cross-section a semiconductor device including typical doping concentrations according to another embodiment.

With respect to FIG. 3, illustrating doping concentrations of a typical semiconductor device in the vertical cross-section, further embodiments will be explained. The structure of the embodiment illustrated in FIG. 3 can be based on any of the above described embodiments. Similar to the above described embodiments, FIG. 3 illustrates a heterojunction semiconductor body. In the cross-section only the left part of a semiconductor cell is illustrated. In this particular case, the heterojunction 60 is formed between the first semiconductor substrate 10 of SiC and the second semiconductor substrate 20 of Si. For exemplification, FIG. 3 contains symbols corresponding to the doping or conductivity type (n and p that can also be reversed) and the semiconductor material (Si and Si).

FIG. 3 also illustrates a first semiconductor substrate 10 of a single crystalline body 11 and an epitaxial layer 12.

Typically, the first semiconductor region 61 (and the not illustrated second semiconductor region 71) has a doping concentration which is equal to or higher than the doping concentration of the body region 62 (and the not illustrated body region 72). Whereas the doping concentration of the body region 62 is typically about $1*10^{16}/cm^3$, but can typically range from about $1*10^{15}/cm^3$ to about $1*10^{17}/cm^3$, the doping concentration the first semiconductor region 61 is typically ranged between about $1*10^{17}/cm^3$ and about $1*10^{18}/cm^3$. In this particular embodiment, the first semiconductor regions 61, 71 in the first semiconductor substrate 10 has a higher doping concentration than in the second semiconductor substrate 20, where the first and second semiconductor regions 61, 71 form body regions 62, 72.

As can be seen from FIG. 3, the doping concentration of the drift region is higher in the first semiconductor substrate 10 than in the second semiconductor substrate 20. To provide a low resistance in the on-state, a thin delta-region 80 of higher conductivity is arranged between the first portion 81 and the second portion 82 of the drift region. The first portion 81 of the drift region has a constriction distal to the heterojunction 60 as described above.

Figure 4:
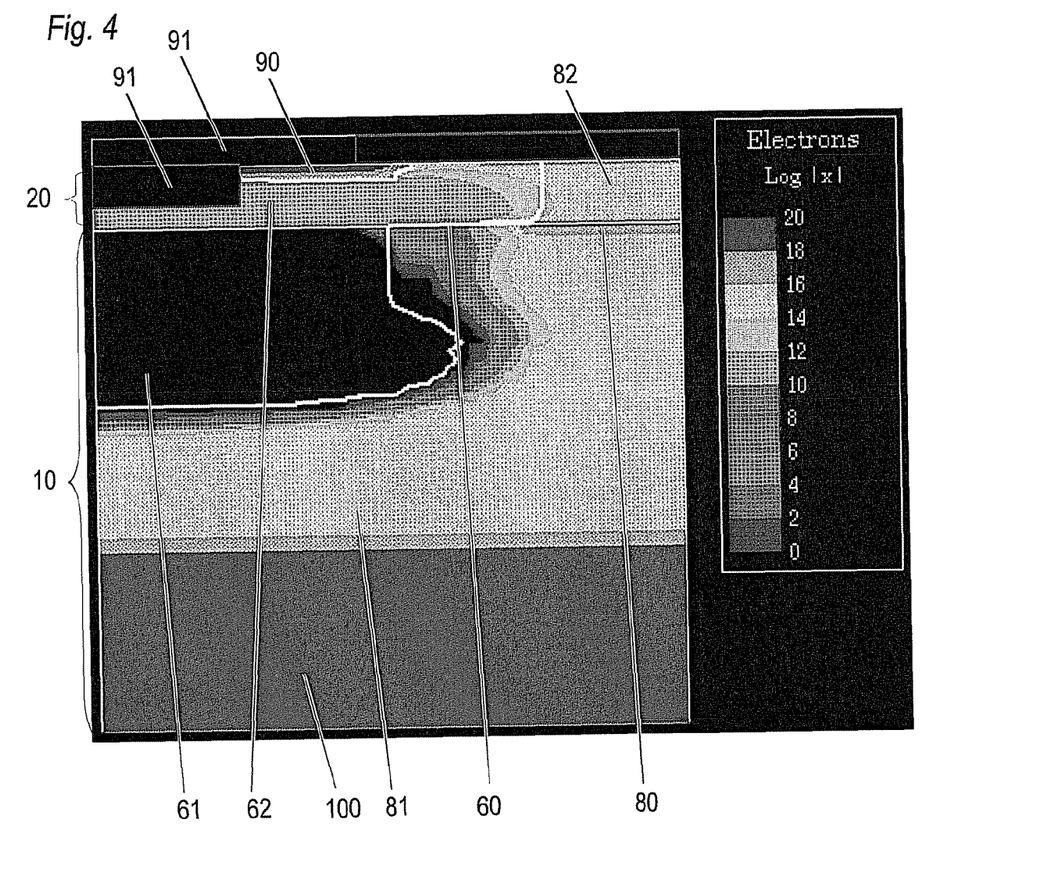
FIG. 4 illustrates a simulation of the electron concentration in the vertical cross-section of the semiconductor device according FIG. 3 during the on-state.

FIG. 4 illustrates the simulated electron concentration of the semiconductor device according FIG. 3 in the vertical cross-section during the on-state. As evident from FIG. 4, an increased electron concentration is observable at the heterojunction due to the thin highly doped semiconductor region 80.

Figure 5:
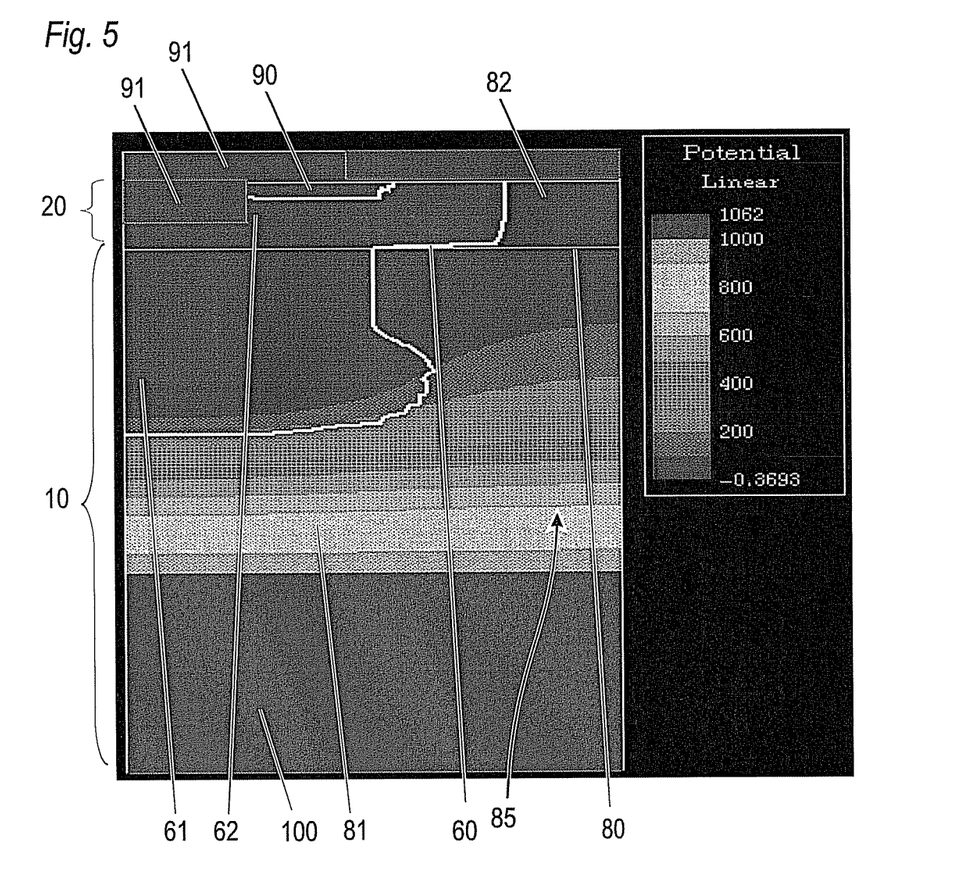
FIG. 5 illustrates a simulation of the electric potential distribution in the vertical cross-section of the semiconductor device according FIG. 3 during reversed bias.

In FIG. 5 the electric potential in the vertical cross-section during reversed bias of the semiconductor device according FIG. 3 is illustrated. As can be seen, most of the iso-potential lines run distal to the heterojunction 60. This means that the main voltage drop occurs within the first semiconductor substrate and distal to the heterojunction 60. The electrical potential drops from about 1000 (arbitrary units) to about 100 within the first semiconductor substrate 10 in a region distant to the heterojunction 60. At the heterojunction 60 the electrical potential remains substantially constant (in comparison with the pronounced reduction of the electrical potential in the first portion 81). Hence, the electrical field strength is reduced at the heterojunction 60 and therefore also in the second semiconductor substrate 20.

Figure 6:
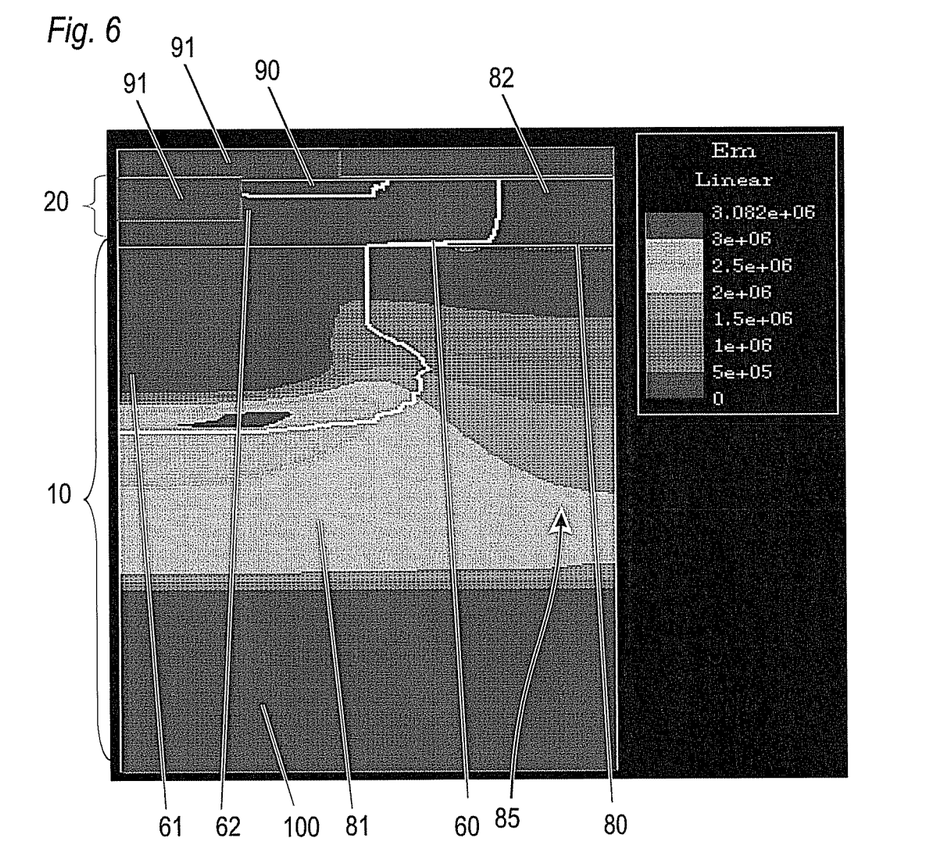
FIG. 6 illustrates a simulation of the absolute value of the electric field distribution in the vertical cross-section of the semiconductor device according FIG. 3 during reversed bias.

To illustrate this, reference is made to FIG. 6 which illustrates the electric field distribution of the semiconductor device according FIG. 3 in terms of the absolute value of the electric field during reversed bias. The highest electric field strength is observed at the plane pn-junction between the first semiconductor region 61 and the first portion 81. Towards the heterojunction 60, the electrical field strength significantly reduces and reaches values which are below the avalanche breakdown values of Si. Thus, the heterojunction is efficiently protected against high electric fields during reversed bias.

With respect to FIGS. 8A to 8E methods for producing a semiconductor device are explained.

Figure 8A:
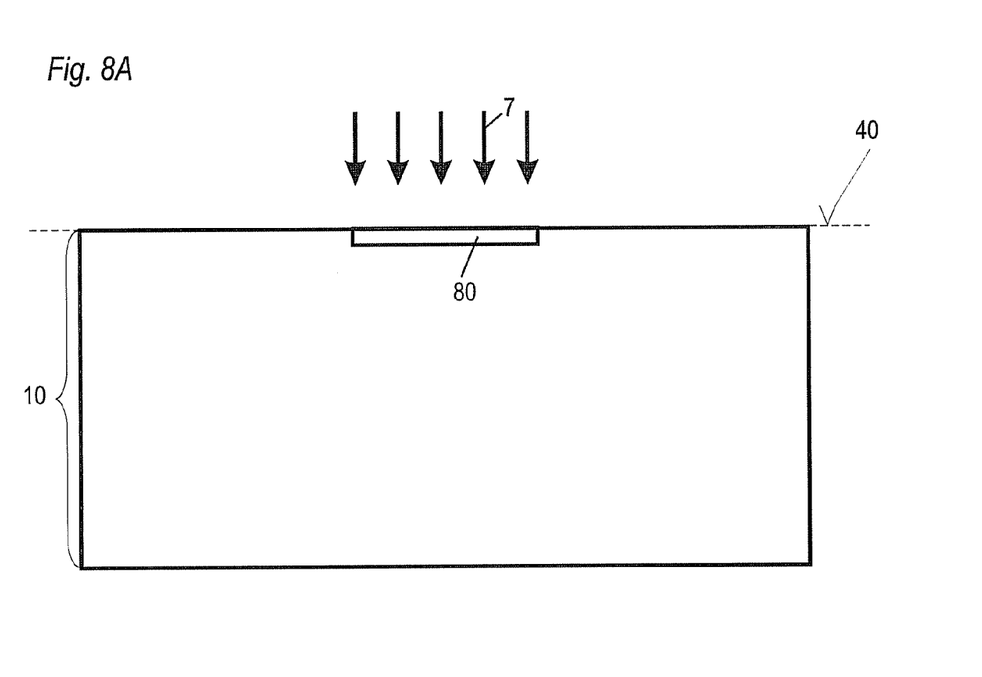
FIGS. 8A to 8E illustrate steps for manufacturing a semiconductor device.

First, the first semiconductor substrate 10 of the second conductivity type is provided. The first semiconductor substrate 10 can be a single-crystalline base material and an epitaxial layer as described above. It is also possible to use a single-crystalline base material without an epitaxial layer as the first semiconductor substrate 10.

Typically, the semiconductor region 80 is subsequently formed by implantation of a dopant 7 of the second conductivity type. A typical dose is from about $1*10^{14}/cm^2$ to about $1*10^{16}/cm^2$. For forming the semiconductor region 80, which prevents the charge carrier depletion as described above, a mask (not illustrated) can be used so that the dopant 7 is mainly implanted into the first semiconductor substrate 10 in the area of the drift region.

Figure 8B:
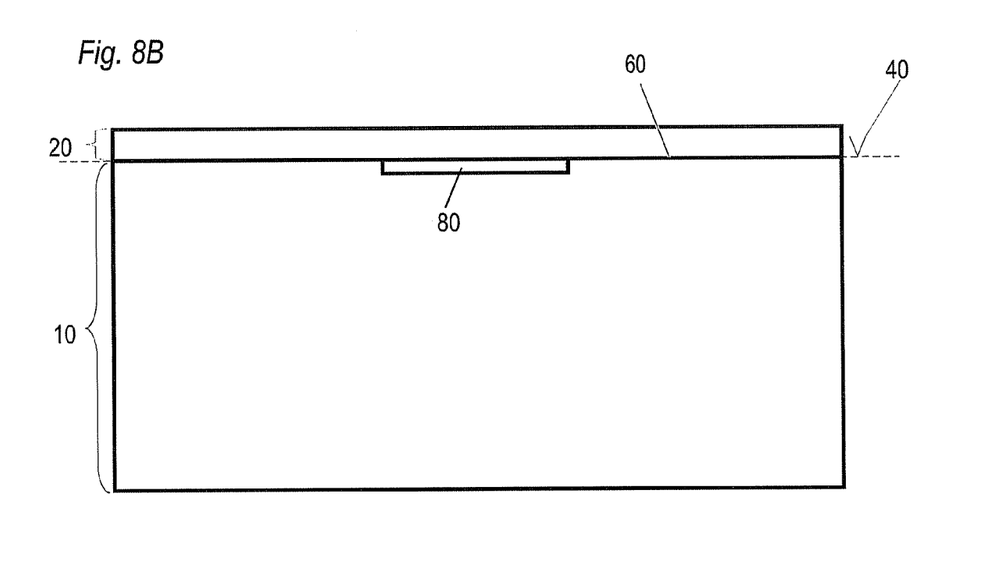

After or before forming the semiconductor region 80 the second semiconductor substrate 20 is formed on the surface 40 of the first semiconductor substrate. Thereby the heterojunction 60 is formed substantially in the first plane 40.

Typically the second semiconductor substrate 20 is formed by deposition of the second semiconductor material, for example, by epitaxial deposition. This is illustrated in FIG. 8B. For deposition molecular beam epitaxy (MBE) can, for example, be used.

Alternatively, the second semiconductor substrate 20 can be bonded to the first semiconductor substrate 10.

Subsequently, the first and second semiconductor regions 61 and 71 are formed by step-wise implantation of a dopant of the first conductivity type to form the respective distal (second) portions 610, 710 and proximate (first) portions 611, 711 respectively, using masks 8 and 9. The masks 8 and 9, which can be formed self-aligned with respect to each other, define the lateral distances d2 and d1, respectively. Different to the sequence illustrated in FIGS. 8C and 8D, proximate portions 611, 711 can be formed first using mask 9. Mask 9 is then isotropically etched to form mask 8 which is then used as implantation mask for forming distal portions 610, 710.

Figure 8C:
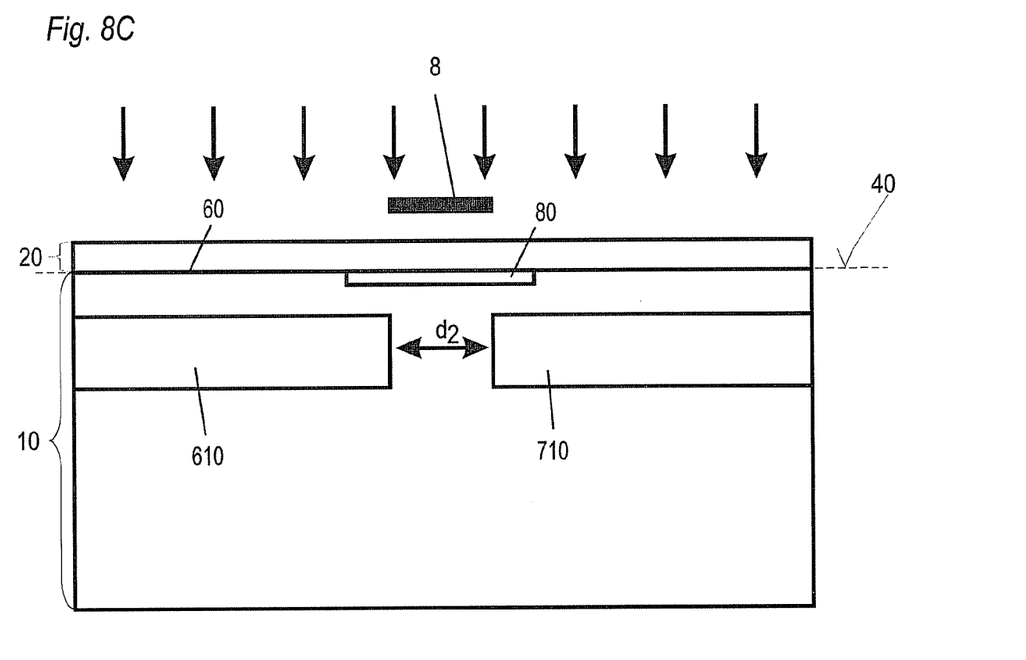
Figure 8D:
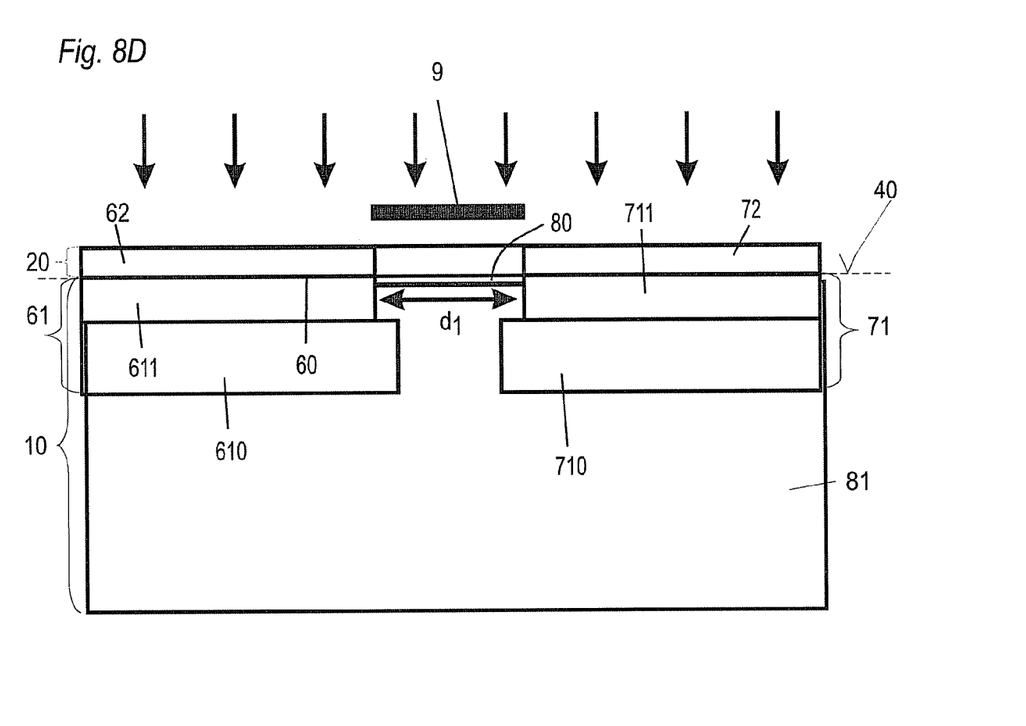

Alternatively, the first and second semiconductor regions 61, 71 (distal and proximate portions 610, 611, 710, 711) of the first conductivity type can be formed by ion implantation prior to forming the second semiconductor substrate 20. In case of SiC, several shallow ion implantation steps might be performed to create sufficiently thick doped region because the diffusion mobility of ion is very low in SiC. Therefore, the first semiconductor substrate 10 can be formed in the following way. First a base semiconductor substrate, which has a base doping concentration of the second conductivity type, is provided. In subsequent steps, layers of SiC are produced by deposition of SiC, using, for example, MBE, which can be selectively doped by ion implantation in intermediate steps as required to form the different semiconductor regions and portions.

Between the first and second semiconductor regions 61, 71 those portions of the first semiconductor substrate 10, which were covered by the masks 8, 9, remain of the second conductivity type and form the first portion 81 of the drift region. Due to the large lateral extension of the distal portions 610, 710, the first portion 81 includes a lateral constriction in the first semiconductor substrate 10 distal to the heterojunction 60.

In further steps, body regions 62 and 72 can be formed, for example by implantation of a dopant of the first type, in the second semiconductor substrate 20 using the same mask 9 as illustrated in FIG. 8D either during forming the portions 611 and 711 or in an additional step.

Figure 8E:
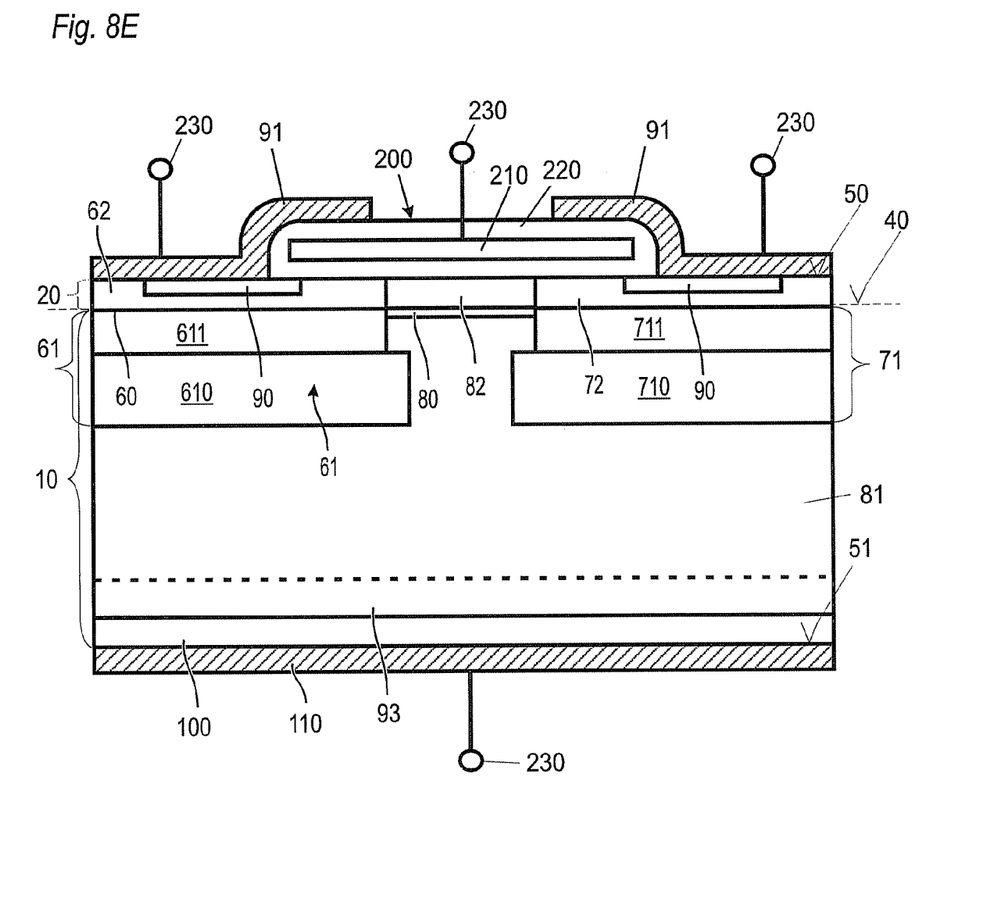

In FIG. 8E a vertical cross-section through a completed vertical MOSFET is illustrated. The vertical MOSFET includes, in addition to the embodiments illustrated in FIG. 8D, the source regions 90, the second portion 82 of a drift region in the second semiconductor substrate 20, the gate electrode 200, the front electrode 91, the drain region 100, the back or drain electrode 110 and external contacts 230. Typically, FIG. 8E corresponds only to a section through a vertical power MOSFET which includes a plurality of substantially identical cells. A full cross-section through a vertical MOSFET would typically include several or a plurality of adjoining structures as illustrated in FIG. 8E. The dashed line 93 denotes an optional field stop region of the second conductivity type.

The written description above uses specific embodiments to disclose the invention, including the best mode, and also to enable any person skilled in the art to make and use the invention. While the invention has been described in terms of various specific embodiments, those skilled in the art will recognize that the invention can be practiced with modification within the spirit and scope of the claims. Especially, mutually non-exclusive features of the embodiments described above may be combined with each other. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a first semiconductor substrate of a first band-gap material;
   a second semiconductor substrate of a second band-gap material, the second band-gap material having a lower band-gap than the first band-gap material;
   a heterojunction formed between the first and the second semiconductor substrate in a first plane; and
   in a cross-section which is perpendicular to the first plane, a first semiconductor region and a second semiconductor region of a first conductivity type each extend from the second semiconductor substrate partially in the first semiconductor substrate, wherein the first and second semiconductor regions are spaced in the first semiconductor substrate in a direction parallel to the first plane by a first distance arranged in an area proximate to the heterojunction and by a second distance arranged in an area distal to the heterojunction, wherein the first distance is larger than the second distance;
   the first semiconductor region and the second semiconductor region being separated from each other by a first portion of a drift region of a second conductivity type which forms pn-junctions with the first semiconductor region and the second semiconductor region, the drift region extending from the second semiconductor substrate into the first semiconductor substrate and includes a portion of the heterojunction, the drift region comprising, in the first semiconductor substrate, a semiconductor region arranged at the heterojunction and comprising at the heterojunction a higher doping concentration than an adjacent region in the first semiconductor substrate;
   wherein the first and the second semiconductor region are spaced apart from each other in the second semiconductor substrate by a distance which is smaller than the first distance.

2. The semiconductor device according to claim 1, wherein the first semiconductor substrate comprises SiC.

3. The semiconductor device according to claim 1, wherein the second semiconductor substrate comprises Si.

4. The semiconductor device according to claim 1, wherein the first and second semiconductor regions comprise a doping concentration in the first semiconductor substrate which is equal to or higher than their respective doping concentration at the second semiconductor substrate.

5. The semiconductor device according to claim 1, wherein each of the first and second semiconductor regions comprises a first and a second portion in the first semiconductor substrate, wherein the respective first portions are arranged proximate to the heterojunction and spaced from each other by the first distance, and the second portions are arranged distal to the heterojunction and spaced from each other by the second distance.

6. The semiconductor device according to claim 1, wherein the first and second semiconductor regions are separated from each other in the first semiconductor substrate by a second portion of the drift region of the second conductivity type.

7. The semiconductor device according to claim 6, further comprising:
   at least two source regions of the second conductivity type which are arranged in the second semiconductor substrate, wherein a respective one of the first and second semiconductor regions are arranged between a respective source region and the second portion of the drift region; and
   a front electrode in contact with each of the source regions and the first and second semiconductor regions;
   wherein the first and second semiconductor region are separated from each other in the first semiconductor substrate by the first portion of the drift region of the second conductivity type; and
   wherein the first portion of the drift region comprises a first doping concentration and the second portion of the drift region comprises a second doping concentration, the first doping concentration being equal to or higher than the second doping concentration.

8. The semiconductor device according to claim 1, wherein the doping concentration of the first and second semiconductor regions ranges from about $1*10^{17}/cm^3$ to about $1*10^{18}/cm^3$.

9. The semiconductor device according to claim 1, further comprising:
   wherein the first and second semiconductor regions have a higher doping concentration than an area of the first portion of the drift region which is laterally bordered by the first and second semiconductor regions;
   wherein the first portion of the drift region comprises a first and a second areas, which are arranged in the first semiconductor substrate;
   wherein the second area is arranged between the first area and the heterojunction, and wherein the first area has a higher doping concentration than the second area; and
   wherein the first portion of the drift region is completely depletable at least in an area distal to the heterojunction.

10. The semiconductor device according to claim 1, wherein the first semiconductor substrate further comprises the semiconductor region at the heterojunction, the semiconductor region at the heterojunction comprising the higher doping concentration than the adjacent region in the first semiconductor substrate, and wherein the semiconductor region at the heterojunction is arranged in the first portion of the drift region comprising the second conductivity type and separating the first and second semiconductor region from each other.

11. The semiconductor device according to claim 1, further comprising:
   at least one gate electrode arranged in proximity to the first and second semiconductor regions, wherein the gate electrode is insulated from the first semiconductor substrate.

12. The semiconductor device according to claim 1, wherein the semiconductor device is a power semiconductor device.

13. The semiconductor device according to claim 1, further comprising a back electrode and a field stop layer of the second conductivity type which has a higher doping concentration than the first portion of the drift region and is arranged between the back electrode and the drift region.

* * * * *